(12) United States Patent
Kim

(10) Patent No.: US 7,176,564 B2
(45) Date of Patent: Feb. 13, 2007

(54) HEAT SPREADER, HEAT SINK, HEAT EXCHANGER AND PDP CHASSIS BASE

(75) Inventor: Seo Young Kim, Seoul (KR)

(73) Assignee: Korea Institute of Science, Seoul (KR)

(\*) Notice: Subject to any disclaimer, the term of this patent is extended or adjusted under 35 U.S.C. 154(b) by 82 days.

(21) Appl. No.: 10/928,893

(22) Filed: Aug. 27, 2004

(65) Prior Publication Data
US 2005/0093140 A1 May 5, 2005

(30) Foreign Application Priority Data
Oct. 25, 2003 (KR) .................... 10-2003-0074903

(51) Int. Cl.
*H01L 23/34* (2006.01)
*H05K 7/20* (2006.01)
(52) U.S. Cl. .................... 257/714; 361/699
(58) Field of Classification Search ......... 257/E23.098
See application file for complete search history.

(56) References Cited

U.S. PATENT DOCUMENTS 3,710,251 A * 1/1973 Hagge et al. ............... 324/760
5,168,919 A * 12/1992 Berenholz et al. .......... 165/80.4
5,764,483 A * 6/1998 Ohashi et al. ............... 361/699
6,658,861 B1 * 12/2003 Ghoshal et al. ............... 62/3.7
2005/0231914 A1 * 10/2005 Mikubo et al. ............. 361/699

FOREIGN PATENT DOCUMENTS

KR 2002-0083712 A 11/2002
KR 2003-0042652 A 6/2003

\* cited by examiner

*Primary Examiner*—Lex H. Malsawma
(74) *Attorney, Agent, or Firm*—Leydig, Voit & Mayer Ltd

(57) ABSTRACT

A heat spreader includes thin films opposite to each other; cooling liquid filling an internal space between the thin films; and a vibration generating means for vibrating the liquid. Accordingly, the heat spreader has excellent heat spread performance compared to a conventional heat spreader, so can have an ultra slim type structure. Also, the heat spreader has excellent heat spread performance regardless of a direction of gravity, and a space between the thin films is sealed in a state of an atmospheric pressure, to maintain the improved heat spread performance for a long time.

18 Claims, 4 Drawing Sheets

HEAT SPREADER, HEAT SINK, HEAT EXCHANGER AND PDP CHASSIS BASE

BACKGROUND OF THE INVENTION

1. Field of the Invention

The present invention relates to a heat spreader, more specifically, to a heat spreader having a structure of improved heat transfer rate and thus enabling reliable heat spread characteristics regardless of its installation direction as well as of a light weight and small size.

2. Description of the Background Art

Recently, a Plasma Display Panel (hereinafter, referred to as "PDP") TV which leads a large screen display market worldwide has a large screen and also an ultra slim type structure so that the PDP TV needs a small space for installation can be easily mounted on a wall. However, a 42 inch PDP TV consuming about 350 W~450 W power gives out most power as heat because of low converting efficiency from electric energy to light energy. Out of totally emitted heat, about 250 W heat is emitted from double glass plate of the PDP and about 100 W heat is emitted from an image signal unit and a power unit arranged near its rear surface. More specifically, about 150 W heat out of 250 W heat from the double glass plate is transferred to a front surface of the PDP by natural convention and radiation, while about 100 W heat out of the 250 W heat from the double glass plate is transferred to a rear surface by conduction.

Accordingly, temperature on front surface of the PDP is getting higher and higher to be about 50° C. by the heat of 150 W transferred to the front surface of the PDP, thereby causing users to feel unpleasantness and inconvenience. For this reason, manufacturers have made an effort to decrease heat transferred to the front surface.

As a part of such an effort, a PDP chassis base mounted at a rear surface of a PDP is made of an aluminum plate with a thickness of about 1.5~2.5 mm so that heat is conducted to the aluminum plate to be transferred to the rear surface. In spite of this effort, when heat distribution in the surface thereof is not uniform, and when a white image combined with 3 primary colors is locally displayed for a long time, excessive heat is concentrated locally therein, and thus an afterimage of the white image is displayed for minutes even after the white image has been removed, thereby causing a degradation in image quality.

In addition, a heat sink is used to emit heat generated in a CPU of an electronic device and in an electronic communication component such as a signal-amplifying module of a mobile communication repeater. In this case, when heat is generated locally in a highly integrated electronic component, the heat can not be spread effectively to a cooling fin of the heat sink through a heat spreader of the heat sink. In order to improve heat spread performance, in a conventional art, a method of decreasing heat spread resistance by thickening a thickness of a heat spreader of a heat sink made of aluminum or copper is used. But this method has disadvantageous effects that the heat sink cannot be installed in a small space due to an excessive increased weight and volume.

In order to solve such a problem, an invention (hereinafter, referred to as 'known invention 1') reducing an installation space by forming a depressed portion 14, 17 is disclosed in Korean Patent Publication Laid-Open No. 2002-0083712. However, the invention 1 has still defects that a thickness of heat sink should be thickened in order to decrease heat spread resistance.

In addition, as another method to spread heat generated locally, a heat spreader including a plate-shaped heat pipe to using a principle of a classical heat pipe is disclosed in Korean Patent Publication Laid-Open No. 2003-0042652. Such a type of heat spreader can be made a thin film structure, thereby having a small size and a lightweight and also having excellent heat spread performance. But the type of heat spreader is applied to very-limited area due to occurring a significant deterioration in performance since an internal space between two thin films has to be maintained in a vacuum, heat spread performance is deteriorated by a change of a degree of vacuum in the internal space after the heat spreader is used for a long time, and if the heat pipe is installed in such a manner that its longitudinal direction is vertical to a gravity direction, the performance of the heat pipe becomes deteriorated because it is difficult for a refrigerant to return against gravity in view of characteristics of the heat pipe.

SUMMARY OF THE INVENTION

Therefore, an object of the present invention is to provide a heat spreader capable of reducing its weight and size and accelerating heat spread without a performance change regardless of an installation direction since the performance of heat transfer is improved and thus its thickness is formed thin.

To achieve these and other advantages and in accordance with the purpose of the present invention, as embodied and broadly described herein, there is provided heat spreader including thin films opposite to each other; cooling liquid filling an internal space between thin films; and a vibration generating means for vibrating the liquid.

Herein, preferably, the thin film is made of metal.

In addition, effectively, a concavo-convex form is formed inside the thin film.

And, preferably, the vibration generating means includes a vibrator installed inside the thin film and applying vibration to the liquid; and a signal generator for generating a frequency signal so as to vibrate the vibrator.

In addition, effectively, the vibration generating means generates a vibration in a direction parallel to the thin film.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention.

In the drawings:

FIG. 1 and FIG. 2 are views showing a structure of a heat spreader in accordance with one embodiment of the present invention, wherein FIG. 1 is a cut perspective view of a heat spreader, and FIG. 2 is a cross sectional view showing a modified example of a concavo-convex form of FIG. 1;

DETAILED DESCRIPTION OF THE PREFERRED EMBODIMENTS

Reference will now be made in detail to the preferred embodiments of the present invention, examples of which are illustrated in the accompanying drawings.

Figure 1:
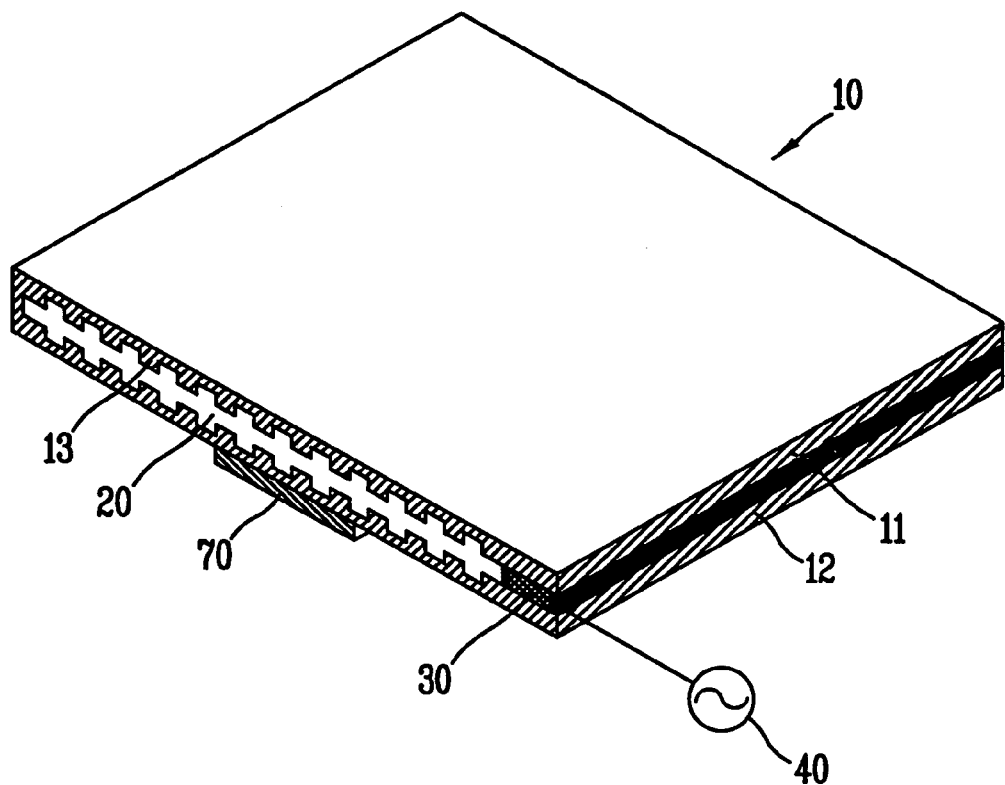
Figure 2:
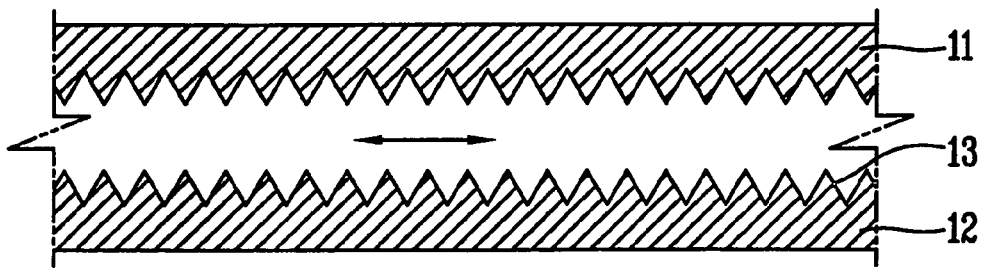

Only, well-known function and structure are not described in detail so as not to obscure the present invention FIGS. 1 and 2 are views showing a structure of a heat spreader in accordance with one embodiment of the present invention, wherein FIG. 1 is a cut perspective view of a heat spreader and FIG. 2 is a cross sectional view showing a modified example of a concavo-convex form of FIG. 1.

As shown therein, a heat spreader 10 in accordance with one embodiment of the present invention includes thin films 11, 12 opposite to each other and forming an internal space 20 therebetween; cooling liquid filling the internal space 20 and a vibration generating means for vibrating the cooling liquid.

The thin films 11, 12 are made of metal having high thermal conductivity, preferably, such as aluminum, copper or the like. In addition, 2 series of concavo-convex forms are formed on inner surface of the thin film 11, 12 for generating turbulent flows by a pulsation. The concavo-convex forms 13 may be formed in a rectangular shape as shown in FIG. 1, and may be formed in a triangular shape as shown in FIG. 2.

As the cooling liquid, liquid with enhanced heat transfer characteristics, such as water, FC-72, is used, FC-72, and FC-72 are product names of Fluorinert solution manufactured by Korea 3M Ltd. The cooling liquid is sealed between the thin films 11, 12 in a state of an atmospheric pressure. Moreover, FC-3255, FC-3283, FC-40, FC-43, FC-70 is preferable used when it is used in high temperature over 100° C. Metal particles such as aluminum, copper can be added in addition to those cooling liquid to enhance the heat transfer characteristics. Meanwhile, R-113, silicone oil, alcohol can be used as cooling liquid.

The vibration generating means includes a vibrator 30 and a signal generator for generating a frequency signal so as to vibrate the vibrator 30. In addition, preferably, the vibrator 30 is installed so as to proceed a vibration in a direction parallel to the thin films 11, 12. And, the frequency signal generator can generate a high frequency signal or a low frequency signal.

Hereinafter, operations of one embodiment of the present invention will now be described.

As shown therein, in case that the heat spreader is exposed to a local heat source 70, heat emitted from the local heat source 70 is intensively transferred to a surface of a thin film in contact with the local heat source 70. But, cooling liquid at the internal space 20 is effectively mixed by the vibrator 30, thereby accelerating heat spread. Accordingly, heat conducted from the local heat source 70 to the thin film 12 is spread to the entire thin film 11, 12. In addition, the concavo-convex forms 13 are formed on its inner surface, thereby much effectively mixing the cooling liquid.

As above, the heat spreader in accordance with one embodiment of the present invention has excellent heat spread performances compared with a conventional heat-conduction type heat spreader, in that it can be made an ultra slim type structure to be applied to lots of area, and that it can maintain the improved heat spread characteristics for a long time by sealing the inner space 20 at atmosphere, and that it has reliable heat spread performance regardless of installation direction.

Figure 3:
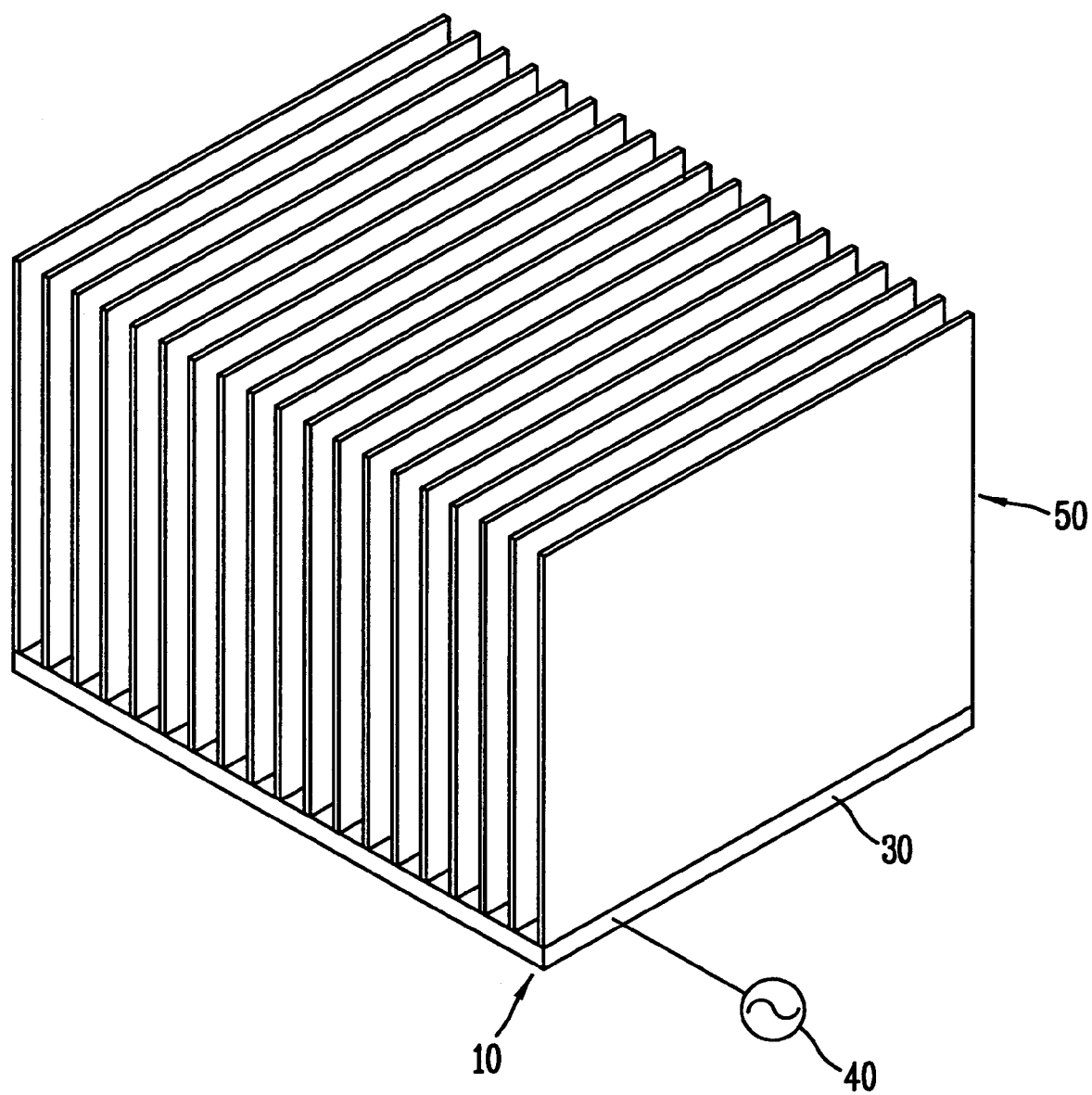
FIG. 3 is a perspective view of a heat sink to which a heat spreader of FIG. 1 is mounted.
Figure 4:
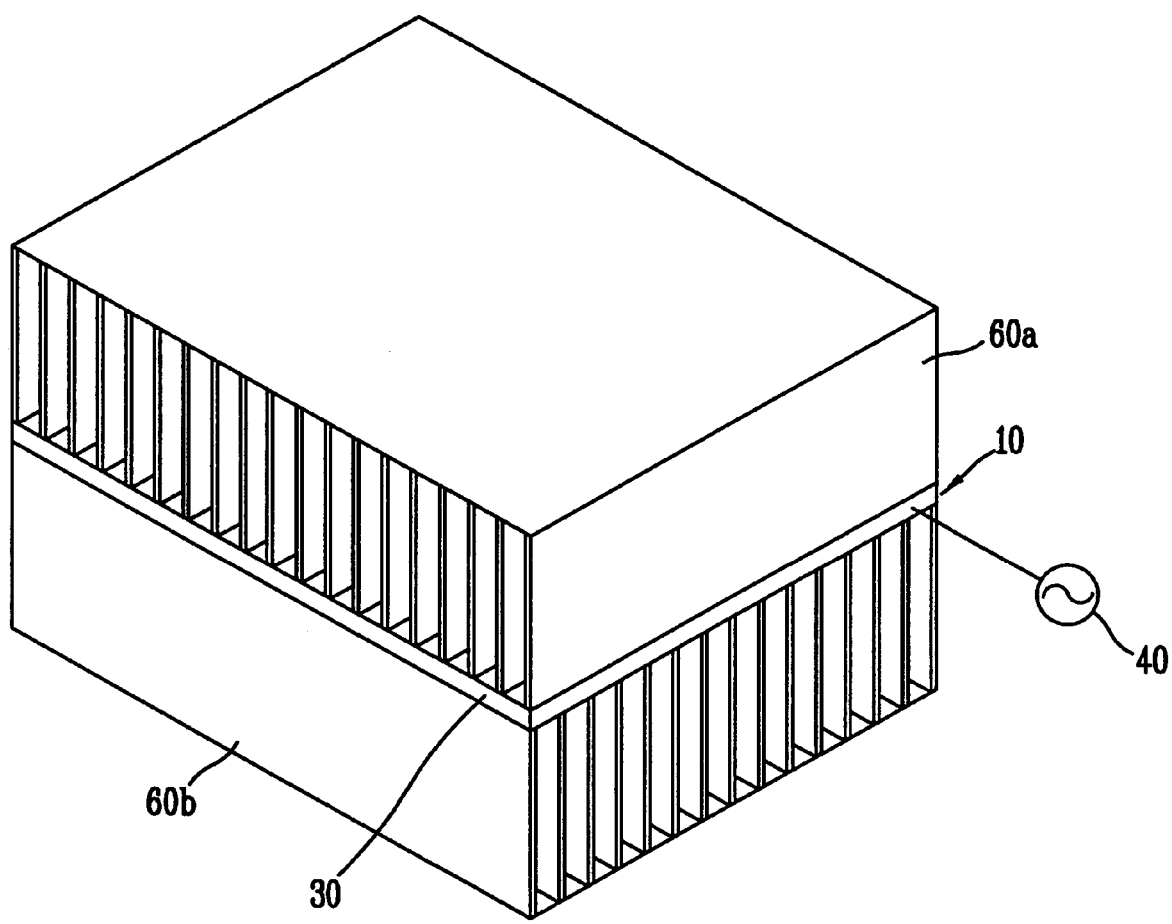
FIG. 4 is a perspective view showing a heat exchanger to which a heat spreader of FIG. 1 is mounted.

As shown in FIG. 3, the heat spreader in accordance with one embodiment of the present invention can be implemented as a heat sink by installing a cooling fin 50 at an upper surface of heat spreader 30. As shown in FIG. 4, the heat spreader can be implemented as a heat exchanger by installing heat exchanging fins 60a, 60b at outer surfaces of both thin films 11, 12 of the heat spreader 30.

Figure 5:
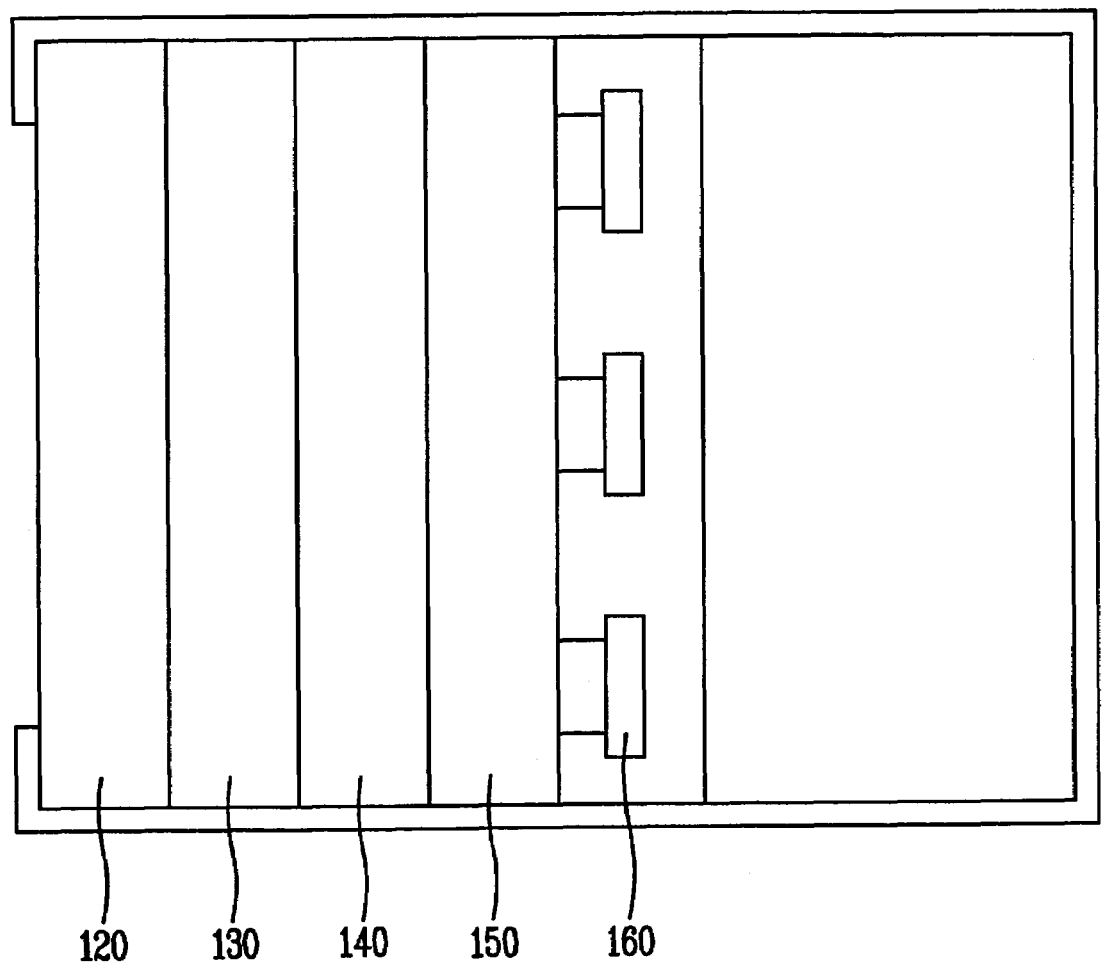
FIG. 5 is a side sectional view of a PDP TV showing that a heat spreader of FIG. 1 is used as a chassis base of a PDP.

In addition, as shown in FIG. 5, a heat spreader is mounted as a PDP chassis base for supporting display glasses 120, 130 of a PDP, so that great amount of heat emitted from the glasses 120, 130 of the PDP can be emitted to a rear surface of a PDP TV.

In FIG. 5, non-explained numerals 140, 150 and 160 are a thermal pad, a heat spreader in accordance with the present invention, and a PCB module respectively.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A heat spreader comprising:
    at least two thin films disposed opposite to each other and defining a sealed internal space between the thin films;
    a cooling liquid filling the internal space between the thin films;
    a vibrator assembly adapted to vibrate the liquid; and
    a concave-convex form formed inside at least one of the thin films adapted to generate turbulent flows of the cooling liquid;
    wherein the vibrator assembly comprises
        a vibrator installed inside the thin films, the vibrator being adapted to vibrate the liquid; and
        a signal generator, the signal generator being adapted to generate a frequency signal that vibrates the vibrator.

2. The heat spreader of claim 1, wherein the thin films are made of metal.

3. The heat spreader of claim 1, wherein the concavo-convex form is formed in a rectangular shape.

4. The heat spreader of claim 1, wherein the concavo-convex form is formed in a triangular shape.

5. The heat spreader of claim 1, wherein the cooling liquid is water.

6. The heat spreader of claim 1, wherein the cooling liquid is one of FC-b 72, FC-77, FC-3255, FC-3283, FC-40, FC-43, and FC-70.

7. The heat spreader of claim 6, wherein the cooling liquid includes metal particles.

8. The heat spreader of claim 1, wherein the cooling liquid is one of alcohol, silicone oil, and R-113.

9. The heat spreader of claim 8, wherein the cooling liquid includes metal particles.

10. The heat spreader of claim 1, wherein the vibrator assembly is adapted to generate vibration in a direction parallel to at least one of the thin films.

11. A heat sink comprising:
    at least two thin films disposed opposite to each other, the thin films each having an outer surface, and defining a sealed internal space between the thin films;

a cooling liquid filling the internal space between the thin films;
at least one cooling fin installed at the outer surface of at least one of the two thin films;
a vibrator assembly adapted to vibrate the cooling liquid; and
a concave-convex form formed inside at least one of the thin films adapted to generate turbulent flows of the cooling liquid;
wherein the vibrator assembly comprises
   a vibrator installed inside the thin films, the vibrator being adapted to vibrate the liquid; and
   a signal generator, the signal generator being adapted to generate a frequency signal that vibrates the vibrator.

12. The heat sink of claim 11, wherein the vibrator assembly is adapted to generate a vibration in a direction parallel to at least one of the thin films.

13. A heat exchanger comprising:
at least two thin films opposite to each other, each said thin film having an outer surface, the thin films defining a sealed internal space between the thin films;
a cooling liquid filling the internal space between the thin films;
heat exchanging fins installed at the outer surfaces of the thin films;
a vibrator assembly adapted to vibrate the cooling liquid; and
a concave-convex form formed inside at least one of the thin films adapted to generate turbulent flows of the cooling liquid;
wherein the vibrator assembly comprises
   a vibrator installed inside the thin films, the vibrator being adapted to vibrate the liquid; and
   a signal generator, the signal generator being adapted to generate a frequency signal that vibrates the vibrator.

14. The heat exchanger of claim 13, wherein the vibrator assembly is adapted to generate a vibration in a direction parallel to at least one of the thin films.

15. A PDP chassis base comprising:
at least two thin films opposite to each other and defining an internal space between the thin films;
cooling liquid filling the internal space between the thin films;
a vibrator assembly adapted to vibrate the cooling liquid; and
a concave-convex form formed inside at least one of the thin films adapted to generate turbulent flows of the cooling liquid;
wherein the vibrator assembly comprises
   a vibrator installed inside the thin films, the vibrator being adapted to vibrate the liquid; and
   a signal generator, the signal generator being adapted to generate a frequency signal that vibrates the vibrator.

16. The PDP chassis base of claim 15, wherein the vibrator assembly is adapted to generate a vibration in a direction parallel to at least one of the thin films.

17. The PDP chassis base of claim 16, further comprising a cooling fin fixed to one side of at least one of the thin films.

18. The PDP chassis base of claim 15, further comprising a cooling fin fixed to one side of at least one of the thin films.

* * * * *